(12) United States Patent
Suzuki et al.

(10) Patent No.: US 8,552,352 B2
(45) Date of Patent: Oct. 8, 2013

(54) SOLID-STATE IMAGING DEVICE INCLUDING CORNER REGISTER

(75) Inventors: Hisanori Suzuki, Hamamatsu (JP);
Yasuhito Yoneta, Hamamatsu (JP);
Shin-ichiro Takagi, Hamamatsu (JP);
Kentaro Maeta, Hamamatsu (JP);
Masaharu Muramatsu, Hamamatsu (JP)

(73) Assignee: Hamamatsu Photonics K.K., Hamamatsu-shi, Sizuoka (JP)

( * ) Notice: Subject to any disclaimer, the term of this patent is extended or adjusted under 35 U.S.C. 154(b) by 333 days.

(21) Appl. No.: 12/920,114

(22) PCT Filed: Jan. 22, 2010

(86) PCT No.: PCT/JP2010/050778
§ 371 (c)(1),
(2), (4) Date: Oct. 20, 2010

(87) PCT Pub. No.: WO2010/087279
PCT Pub. Date: Aug. 5, 2010

(65) Prior Publication Data
US 2011/0024606 A1      Feb. 3, 2011

(30) Foreign Application Priority Data
Jan. 30, 2009 (JP) ................................ P2009-020453

(51) Int. Cl.
*H01L 27/00* (2006.01)
*H04N 5/335* (2011.01)

(52) U.S. Cl.
USPC ........................................ 250/208.1; 348/311

(58) Field of Classification Search
USPC ................................ 250/208.1; 348/311–317
See application file for complete search history.

(56) References Cited

U.S. PATENT DOCUMENTS

| 5,337,340 A | 8/1994 | Hynecek |
| 6,278,142 B1 | 8/2001 | Hynecek |

(Continued)

FOREIGN PATENT DOCUMENTS

| EP | 0866501 | 9/1998 |
| EP | 1 152 469 | 11/2001 |

(Continued)

OTHER PUBLICATIONS

"e2v CCD97-00 Back Illuminated 2-Phase IMO Series Electron Multiplying CCD Sensor," Spec Sheet—e2v Technologies Limited, May 2004, Issue 3, pp. 1-15.

*Primary Examiner* — Thanh Luu
*Assistant Examiner* — Renee Naphas
(74) *Attorney, Agent, or Firm* — Drinker Biddle & Reath LLP

(57) ABSTRACT

A solid-state imaging device of an embodiment includes an imaging region, an output register, a corner register, a multiplication register, a first amplifier, a second amplifier, and a valve gate electrode. The output register is a transfer register that receives a charge transferred from the imaging region to transfer the charge. The output register is capable of selectively transferring a charge in one direction and in the other direction opposite to the one direction. The corner register transfers a charge transferred in one direction from the output register. The multiplication register receives a charge from the corner register and generates and transfers a multiplied charge. The first amplifier generates a signal based on a multiplied charge from the multiplication register. The second amplifier generates a signal based on a charge transferred in the other direction by the output register. The valve gate electrode is an electrode for preventing a transfer of a charge between the output register and the corner register.

5 Claims, 9 Drawing Sheets

(56) References Cited

U.S. PATENT DOCUMENTS

| | | |
|---|---|---|
| 6,444,968 B1 | 9/2002 | Burt et al. |
| 6,862,333 B2 | 3/2005 | Kashima et al. |
| 7,190,400 B2 | 3/2007 | Hynecek |
| 7,291,821 B2 | 11/2007 | Robbins |
| 7,420,605 B2 | 9/2008 | Pool et al. |
| 2003/0035057 A1 | 2/2003 | Hakamata et al. |
| 2003/0042400 A1 | 3/2003 | Hynecek |
| 2004/0026623 A1 | 2/2004 | Doty et al. |
| 2004/0150737 A1 | 8/2004 | Pool et al. |
| 2005/0029553 A1 | 2/2005 | Hynecek |
| 2006/0055802 A1 | 3/2006 | Parks |
| 2007/0146521 A1 | 6/2007 | Robbins |
| 2008/0137801 A1 | 6/2008 | Hadfield |

FOREIGN PATENT DOCUMENTS

| | | |
|---|---|---|
| JP | 5-30432 | 2/1993 |
| JP | H10-304256 | 11/1998 |
| JP | 2002-218327 | 8/2002 |
| JP | 2002-325720 | 11/2002 |
| JP | 2003-158679 | 5/2003 |
| JP | 2006-227315 | 8/2006 |

(a)

(b)

SOLID-STATE IMAGING DEVICE INCLUDING CORNER REGISTER

TECHNICAL FIELD

The present invention relates to a charge multiplying solid-state imaging device.

BACKGROUND ART

As a charge multiplying solid-state imaging device, one described in the following Non-Patent Literature 1 is known. The solid-state imaging device described in Non-Patent Literature 1 includes an imaging region, an output register, a corner register, a multiplication register, a first amplifier, an overscan element, and a second amplifier. This solid-state imaging device, when multiplying a charge from the imaging region, transfers the charge from the imaging region in one direction by the output register, transfers the charge from the output register to the multiplication register via the corner register, multiplies the charge by the multiplication register, and outputs a signal based on the multiplied charge from the first amplifier. On the other hand, this solid-state imaging device, when not multiplying a charge from the imaging region, transfers the charge from the imaging region in the other direction by the output register, transfers the charge from the output register by the overscan element, and outputs a signal based on the charge from the second amplifier.

In addition, among charge multiplying solid-state imaging devices, there are multi-port solid-state imaging devices. For example, a dual-port solid-state imaging device includes an imaging region, an output register, a first corner register, a first multiplication register, a first amplifier, a second corner register, a second multiplication register, and a second amplifier. In the dual-port solid-state imaging device, the imaging region is divided into first and second areas containing one or more pixel columns. This dual-port solid-state imaging device transfers a charge from the first area in one direction by the output register, transfers the charge to the first multiplication register via the first corner register, transfers the charge by the first multiplication register, and outputs a signal based on the multiplied charge from the first amplifier. Simultaneously, this dual-port solid-state imaging device transfers a charge from the second area in the other direction by the output register, transfers the charge to the second multiplication register via the second corner register, multiplies the charge by the second multiplication register, and outputs a signal based on the multiplied charge from the second amplifier.

Further, this dual-port solid-state imaging device, based on a charge from the whole area of the imaging region, can output a signal from one of the first and second amplifiers. For example, when outputting a signal from only the first amplifier, the dual-port solid-state imaging device transfers a charge from the whole area of the imaging region in one direction by the output register, transfers the charge to the first multiplication register via the first corner register, multiplies the charge by the first multiplication register, and outputs a signal based on the multiplied charge from the first amplifier.

CITATION LIST

Non Patent Literature

Non-Patent Literature 1: E2V CCD97-00 Back Illuminated 2-Phase IMO Series Electron Multiplying CCD Sensor Spec Sheet

SUMMARY OF INVENTION

Technical Problem

The charge multiplying solid-state imaging device described in Non-Patent Literature 1 or the foregoing multi-port charge multiplying solid-state imaging device, when outputting a charge from only one of the two amplifiers, may have produced noise.

It is an object of the present invention to provide a charge multiplying solid-state imaging device that is capable of reducing noise.

Solution to Problem

The inventor of the present application has discovered that the charge multiplying solid-state imaging device described in Non-Patent Literature 1, when outputting a signal from only the second amplifier, produces noise as a result of a charge from the unused corner register and multiplication register flowing into the output register. The inventor of the present application has also discovered that the foregoing multi-port charge multiplying solid-state imaging device, when outputting a signal from only one amplifier, produces noise as a result of a charge from an unused corner register and multiplication register flowing into the output register. The present invention has been made based on such knowledge.

A solid-state imaging device of the present invention includes an imaging region, an output register, a corner register, a multiplication register, a first amplifier, a second amplifier, and a valve gate electrode. The output register is a transfer register that receives a charge transferred from the imaging region to transfer the charge. The output register is capable of selectively transferring a charge in one direction and in the other direction opposite to the one direction. The corner register transfers a charge transferred in one direction from the output register. The multiplication register receives the charge from the corner register and generates and transfers a multiplied charge. The first, amplifier generates a signal based on the multiplied charge from the multiplication register. The second amplifier generates a signal based on a charge transferred in the other direction by the output register. The valve gate electrode is an electrode for preventing a transfer of a charge between the output register and the corner register.

This solid-state imaging device, by supplying voltage to the valve gate electrode when outputting a signal from the second amplifier, can prevent a charge from the unused corner register and multiplication register from flowing into the output register.

It is preferable that the solid-state imaging device of the present invention further includes an overflow drain for discharging a charge accumulated in the corner register and the multiplication register. As a result of discharging a charge accumulated in the corner register and the multiplication register by the overflow drain, the influence of a charge from the unused corner register and multiplication register on other elements is reduced.

It is preferable that the solid-state imaging device of the present invention further includes an overscan element that is a register for transferring a charge transferred in the other direction from the output register to the second amplifier, and another valve gate electrode for preventing a transfer of a charge between the output register and the overscan element. This configuration allows, by supplying voltage to the other valve gate electrode when outputting a signal from the first amplifier, preventing a charge from the overscan element from flowing into the output register.

Another solid-state imaging device of the present invention includes an imaging region, an output register, a first corner register, a first multiplication register, a first amplifier, a second corner register, a second multiplication register, a second amplifier, a first valve gate electrode, and a second valve gate electrode. The output register is a transfer register that receives a charge transferred from the imaging region to transfer the charge. The output register is capable of selectively transferring a charge in one direction and in the other direction opposite to the one direction. The first corner register transfers a charge transferred in one direction from the output register. The first multiplication register receives the charge from the first corner register and generates and transfers a multiplied charge. The first amplifier outputs a signal based on the multiplied charge from the first multiplication register. The second corner register transfers a charge transferred in the other direction from the output register. The second multiplication register receives the charge from the second corner register and generates and transfers a multiplied charge. A signal based on the multiplied charge from the second multiplication register is output by the second amplifier. The first valve gate electrode is an electrode for preventing a transfer of a charge between the output register and the first corner register. The second valve gate electrode is an electrode for preventing a transfer of a charge between the output register and the second corner register.

This solid-state imaging device allows, when outputting a signal from one of the first amplifier and the second amplifier, preventing a charge from the unused corner register and multiplication register from flowing into the output register by supplying voltage to a corresponding one of the first valve gate electrode and the second valve gate electrode.

Moreover, it is preferable that the solid-state imaging device of the present invention further includes an overflow drain for discharging a charge accumulated in the first and second corner registers and the first and second multiplication registers. As a result of discharging a charge by the overflow drain, the influence of a charge from the unused corner register and multiplication register on other elements is reduced.

Advantageous Effects of Invention

As has been described above, according to the present invention, because a charge from the unused corner register and multiplication register can be prevented from flowing into the output register, a charge multiplying solid-state imaging device that is capable of reducing noise is provided.

DESCRIPTION OF EMBODIMENTS

Figure 1:
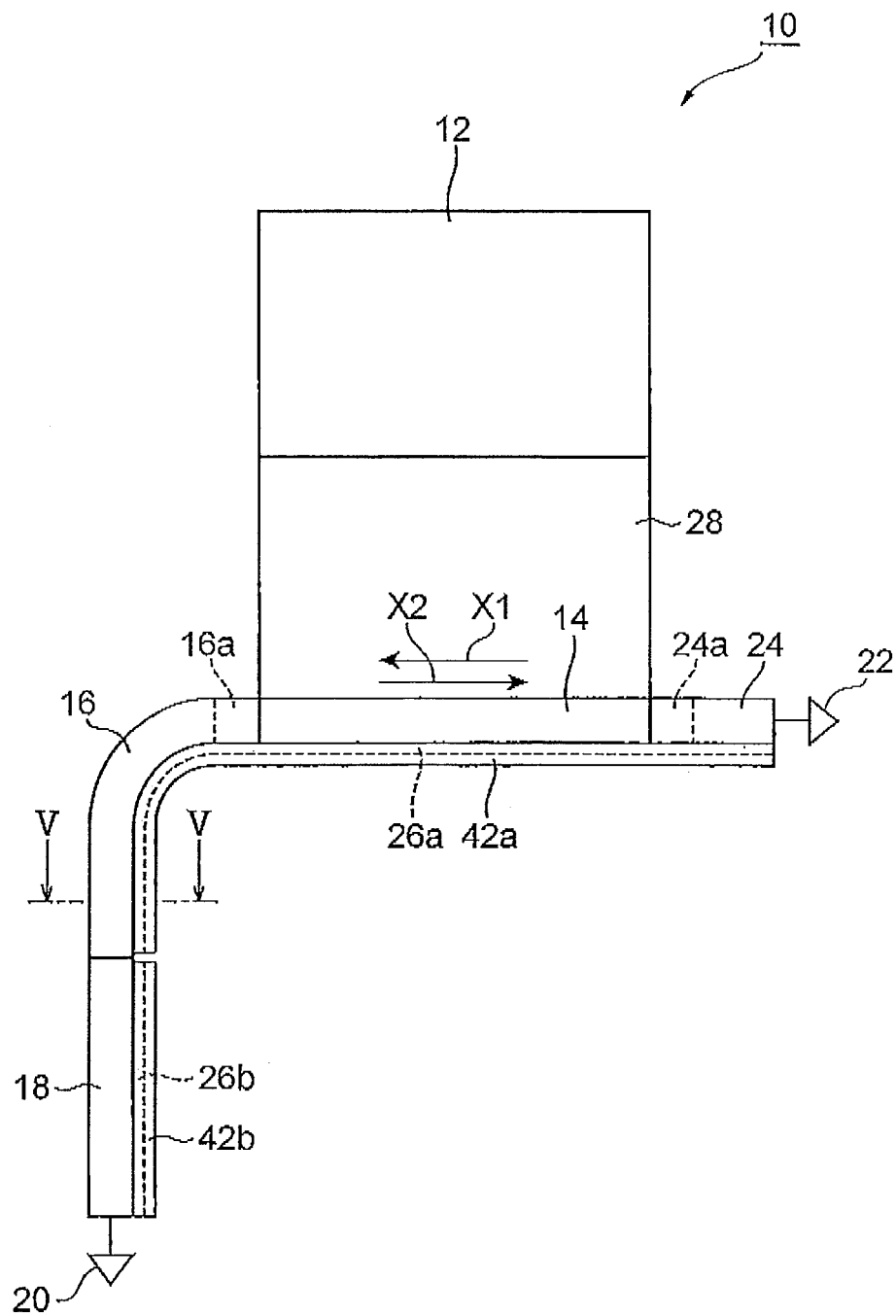
FIG. 1 is a view showing a solid-state imaging device according to an embodiment.

Hereinafter, a preferred embodiment of the present invention will be described in detail with reference to the drawings. Also, the same or corresponding parts will be denoted with the same reference numerals in the drawings.

Figure 2:
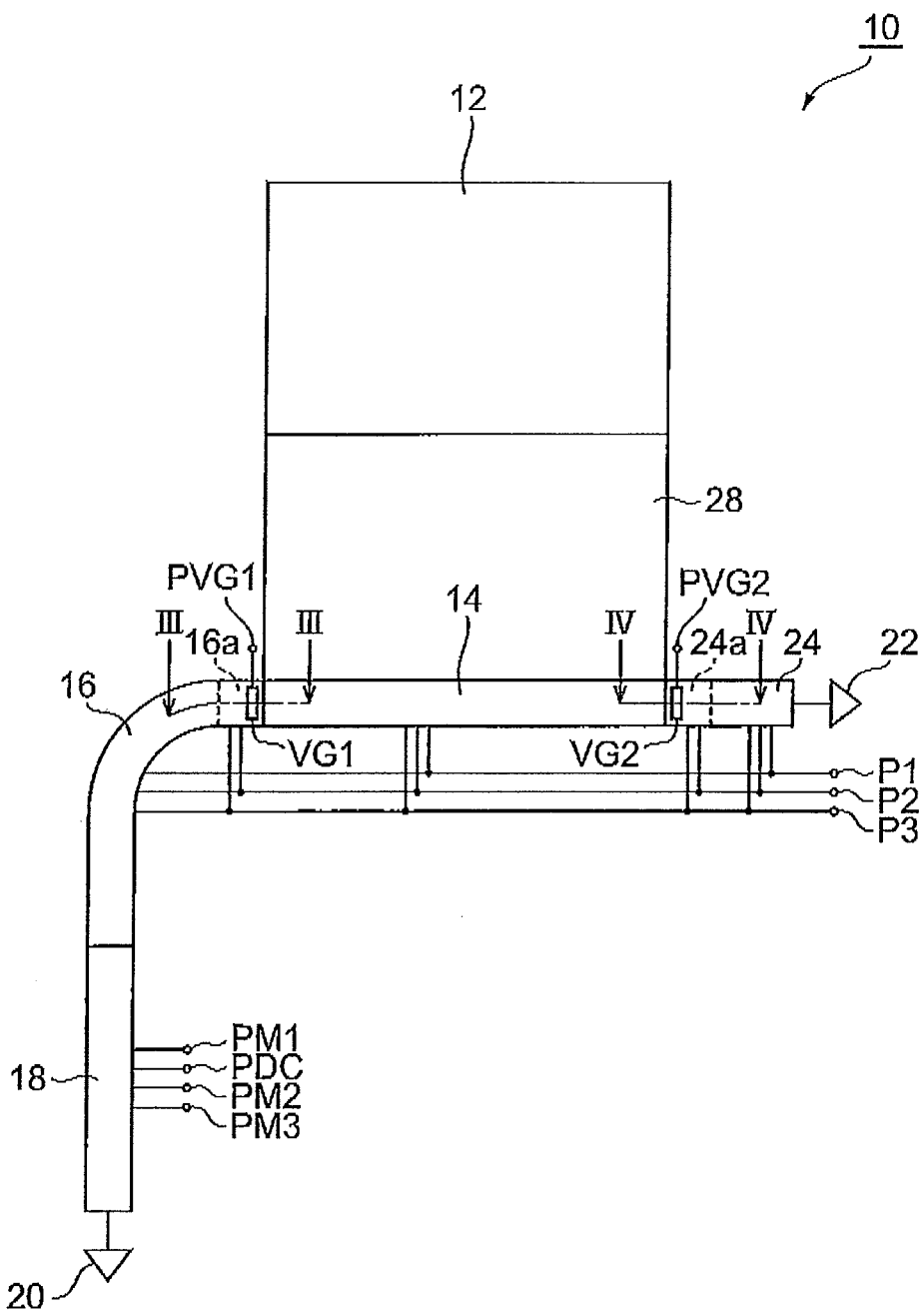
FIG. 2 is a view showing with wiring the solid-state imaging device shown in FIG. 1.

FIG. 1 is a view showing a solid-state imaging device according to an embodiment. FIG. 2 is a view showing with wiring the solid-state imaging device shown in FIG. 1. Also, in FIG. 2, an overflow drain to be described later is not shown.

A solid-state imaging device 10 shown in FIG. 1 and FIG. 2 includes an imaging region 12, an output register 14, a corner register 16, a multiplication register 18, a first amplifier 20, a second amplifier 22, and a first valve gate electrode VG1. Moreover, the solid-state imaging device 10 may further include an overscan element 24, overflow drains 26a and 26b, and a second valve gate electrode VG2.

The imaging region 12 is a region that generates a charge in response to incident light. Specifically, the imaging region 12 includes a plurality of pixels arrayed two-dimensionally, and each pixel includes a photo diode.

The solid-state imaging device 10 of the present embodiment includes a charge accumulating region 28 in addition to the imaging region 12. The charge accumulating region 28 is a section that temporarily accumulates a charge generated by the imaging region 12 before transferring the charge to an output register to be described later. The solid-state imaging device 10 having such a charge accumulating region 28 is called a frame transfer CCD image sensor. However, the solid-state imaging device of the present invention may be an interline CCD image sensor or a full-frame transfer CCD image sensor.

Figure 9:
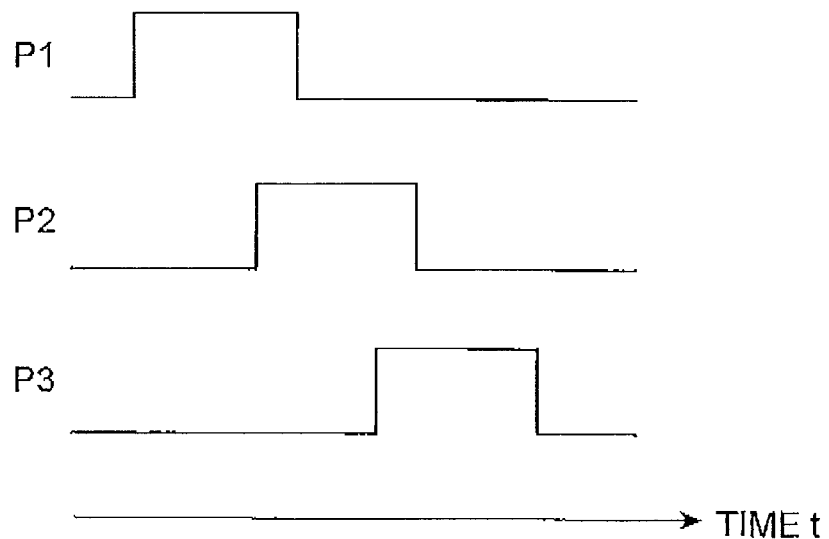
FIG. 9 are diagrams showing examples of 3-phase clock signals.
Figure 9:
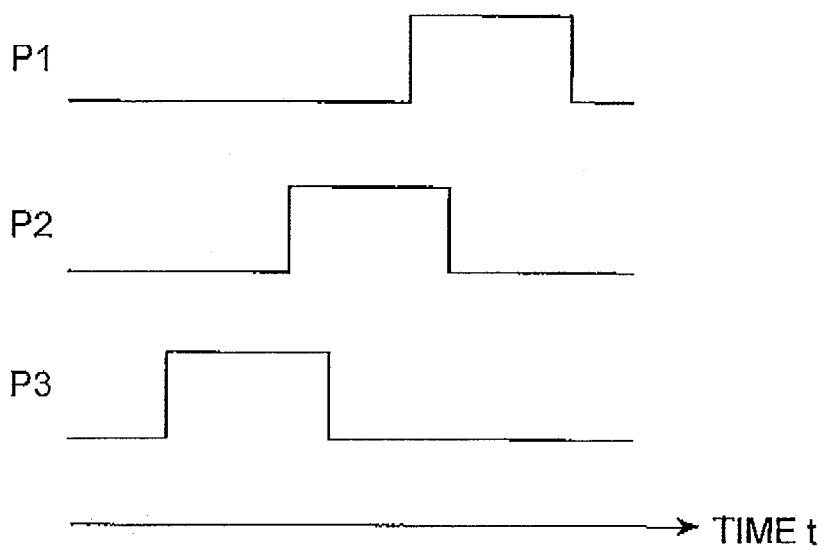

The output register 14 is a transfer register that receives a charge generated by the imaging region 12 and then transferred in the vertical direction to transfer the charge in the horizontal direction. The output register 14 is capable of selectively transferring a charge in one direction X1 and the other direction X2 opposite to the one direction X1. Specifically, as shown in FIG. 2, the output register 14 transfers a charge as a result of receiving 3-phase clock signals supplied to terminals P1 to P3. The 3-phase clock signals are, in the case of transferring a charge in one direction X1, supplied in a partially overlapped manner to the terminals P1, P2, and P3 in this order (refer to (a) in FIG. 9), and in the case of transferring a charge in the other direction X2, supplied in a partially overlapped manner to the terminals P3, P2, and P1 in this order (refer to (b) in FIG. 9). In addition, the wirings extending from the terminals P1 to P3 are wirings common to the output register 14, the corner register 16, and the overscan element 24, and connected to the output register 14, the corner register 16, and the overscan element 24, respectively.

The corner register 16 receives a charge transferred in the X1 direction from the output register 14, and transfers the charge further to the multiplication register 18. Specifically, the corner register 16 transfers a charge as a result of receiving the foregoing 3-phase clock signals.

The multiplication register 18 is a register that multiplies a charge by an impact ionization effect, and transfers the multiplied charge. The multiplication register 18 receives a charge from the corner register 16 to generate a multiplied charge, and transfers the multiplied charge to the first amplifier 20.

As shown in FIG. 2, the multiplication register is connected with wirings extending from terminals PM1 to PM3 and PDC. The terminals PM1 to PM3 are terminals for inputting 3-phase clock signals to the multiplication register 18. The terminal PDC is a terminal that is input with a DC voltage for forming a barrier in the multiplication register 18. The multiplication register 18, as a result of receiving signals input to these terminals PM1 to PM3 and PDC, generates a multiplied charge, and transfers the charge.

The first amplifier 20 receives a charge multiplied by the multiplication register 18 to perform charge-voltage conversion, and generates a signal according to the amount of charge received. As the first amplifier 20, a floating diffusion amplifier may be used.

The second amplifier 22 receives via the overscan element 24 a charge transferred in the other direction X2 by the output register 14, and outputs a signal according to the amount of charge. As this second amplifier 22, a floating diffusion amplifier may be used. In addition, the overscan element 24, like the output register 14, is a transfer register that, as a result of receiving 3-phase clock signals supplied to the terminals P1 to P3, transfers a charge to the second amplifier 22.

Hereinafter, the first valve gate electrode VG1 and the second valve gate electrode VG2 will be described with reference to FIG. 3 and FIG. 4 as well as FIG. 2. Here, FIG. 3 is a cross-sectional view along a line of FIG. 2, and FIG. 4 is a cross-sectional view along a line IV-IV of FIG. 2.

Figure 3:
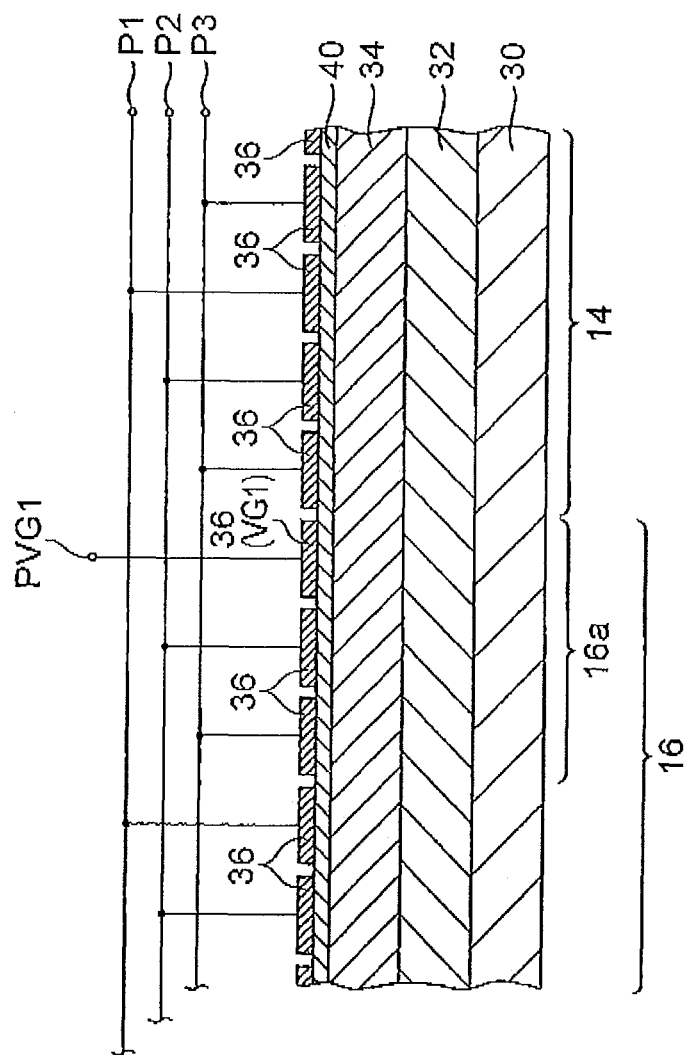
FIG. 3 is a cross-sectional view along a line of FIG. 2.

As shown in FIG. 3, the solid-state imaging device 10 includes a p-type substrate 30, a p-type epitaxial layer 32, an n-type region 34, and a plurality of electrodes 36. The p-type epitaxial layer 32 is provided on the p-type substrate 30, and the n-type region 34 is a region formed by doping from the top of the p-type epitaxial layer 32 an n-type dopant into a partial region of the layer 32. The electrodes 36 are provided above the n-type region 34 and on the dielectric layer 40. Each stage of the output register 14 and corner register 16 is configured with the p-type substrate 30, the p-type epitaxial layer 32, the n-type region 34, and three electrodes 36.

The first valve gate electrode VG1 is an electrode that exists at the closest position to the output register 14 among the three electrodes 36 configuring a stage 16a, of the corner register 16. The stage 16a is adjacent to the output register 14. To the first valve gate electrode VG1, in the case of using the corner register 16, that is, when outputting a signal from the first amplifier 20, the same signal as a clock signal to be supplied to the terminal P1 out of the 3-phase clock signals is supplied. However, the first valve gate electrode VG1 is connected to a terminal PVG1 different from the terminal P1. In the case of not using the corner register 16, that is, when outputting a signal from the second amplifier 22, a predetermined voltage is supplied to the first valve gate electrode VG1 from the terminal PVG1. Accordingly, a charge from the multiplication register 18 and corner register 16 is prevented from flowing into the output register 14.

Figure 4:
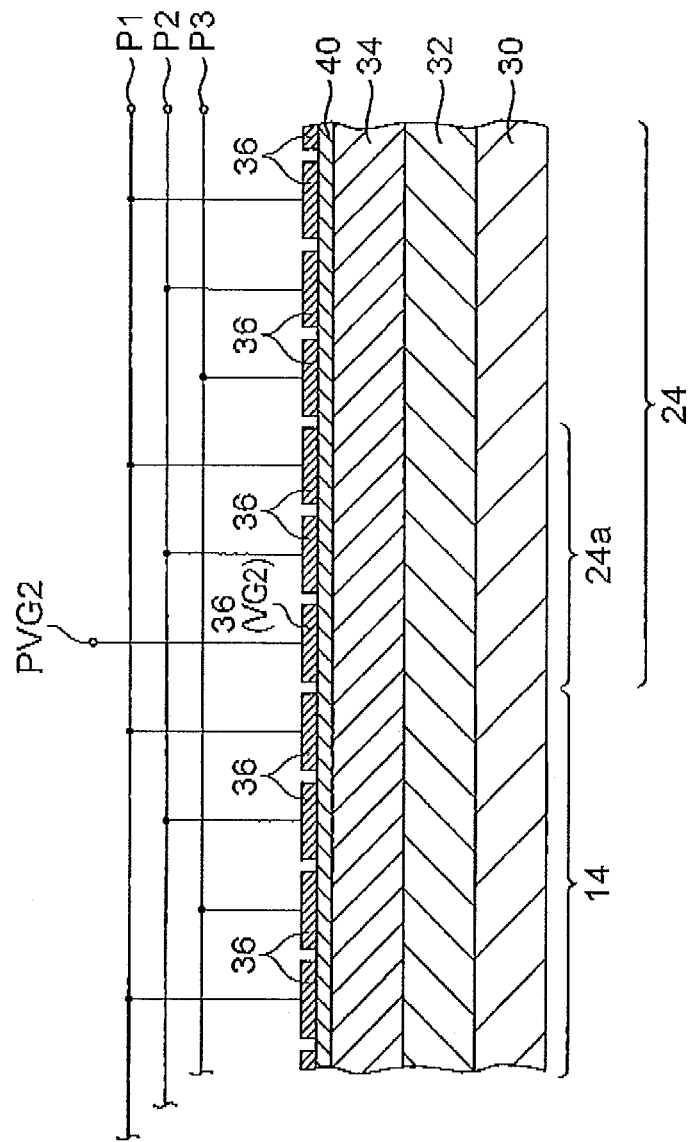
FIG. 4 is a cross-sectional view along a line IV-IV of FIG. 2.

As shown in FIG. 4, each stage of the overseen element 24 is also composed of the p-type substrate 30, the p-type epitaxial layer 32, the n-type region 34, and three electrodes 36. The second valve gate electrode VG2 is an electrode closest to the output register 14 among the three electrodes 36 configuring a stage 24a of the overseen element 24. The stage 24a is adjacent to the output register 14.

To the second valve gate electrode VG2, in the case of using the overscan element 24, that is, when outputting a signal from the second amplifier 22, the same signal as a clock signal to be supplied to the terminal P3 out of the 3-phase clock signals is supplied. However, the second valve gate electrode VG2 is connected to a terminal PVG2 different from the terminal P3. In the case of not using the overseen element 24, that is, when outputting a signal from the first amplifier 20, a predetermined voltage is supplied to the second valve gate electrode VG2 from the PVG2. Accordingly, a charge from the overseen element 24 is prevented from flowing in the output register 14.

Figure 5:
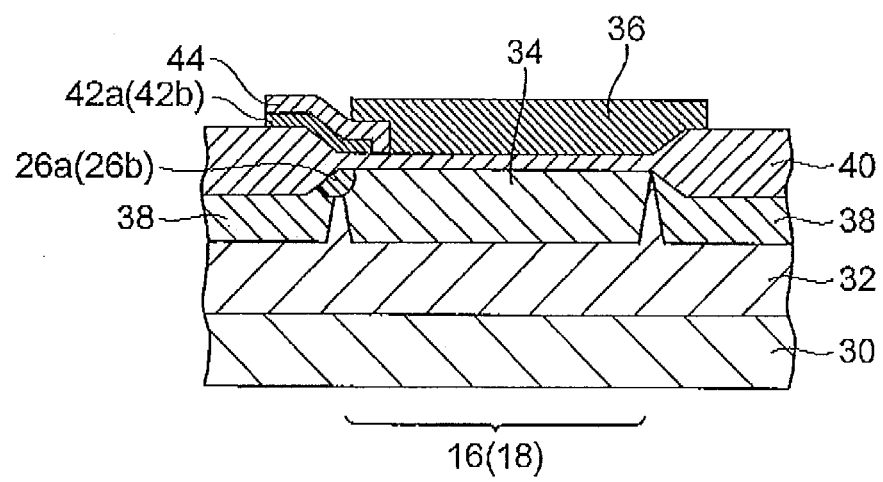
FIG. 5 is a cross-sectional view along a line V-V of FIG. 1 showing an example of an overflow drain.

Next, referring to FIG. 1 and FIG. 5, the overflow drains 26a and 26b will be described, FIG. 5 is a cross-sectional view along a line V-V of FIG. 1 showing an example of an overflow drain.

As shown in FIG. 5, a $p^+$-type channel stop layers 38 is formed at both sides of the n-type region 34. On the n-type region 34 and the channel stop layer 38, the dielectric layer 40 such as a $SiO_2$ layer is provided. The overflow drain 26a is an $n^+$-type semiconductor region, and provided along an edge of the n-type region 34. In addition, above the overflow drain 26a and on the dielectric layer 40, an overflow gate 42a is fainted. The overflow gate 42a and the electrode 36 are electrically separated by a dielectric layer 44. To the overflow drain 26a having such a structure, by supplying a predetermined voltage to the gate 42a, a charge accumulated in the corner register 16 is discharged.

The overflow drain 26b is, like the overflow drain 26a, also provided along the n-type region 34 configuring the multiplication register 18, and an overflow gate 42b (not shown) is formed above the overflow drain 26b. To the overflow drain 26b, by supplying a predetermined voltage to the gate 42b, a charge accumulated in the multiplication register 18 is discharged.

As shown in FIG. 1, the overflow drain 26a and the gate 42a are provided along edges of the corner register 16, the output register 14, and the overscan element 24. Moreover, the overflow drain 26b and the gate 42b are separated from the overflow drain 26a and the gate 42a, and provided along the multiplication register 18.

Figure 6:
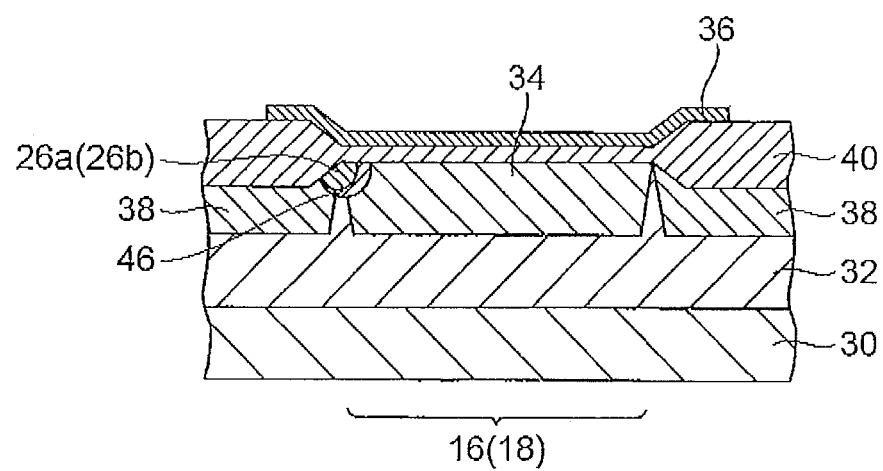
FIG. 6 is a cross-sectional view showing another example of an overflow drain.

Also, as shown in FIG. 6, in place of the overflow gate, an $n^-$=type semiconductor region 46 may be provided between the overflow drain 26a, 26b and the n-type region 34.

Hereinafter, the operation of the solid-state imaging device 10 will de described. In the solid-state imaging device 10, when outputting a signal based on a charge from the imaging region 12 from the first amplifier 20, the charge from the imaging region 12 is transferred by the output register 14 in one direction X1. This charge is transferred to the multiplication register 18 via the corner register 16. Then, a multiplied charge is generated while being transferred by the multiplication register 18, and a signal based on the multiplied charge is generated by the first amplifier 20. In the case of outputting a signal from the first amplifier 20 as such, a predetermined voltage is supplied from the terminal PVG2 to the second valve gate electrode VG2. Accordingly, an unnecessary charge from the unused overscan element 24 is prevented from flowing into the output register 14. As a result, noise in an output signal from the solid-state imaging device 10 is reduced.

On the other hand, when outputting a signal from the second amplifier 22, the charge from the imaging region 12 is transferred by the output register 14 in the other direction X2. This charge is further transferred by the overscan element 24. Then, a signal based on the charge from the overscan element 24 is generated by the second amplifier 22. In the case of outputting a signal from the second amplifier 22 as such, a predetermined voltage is supplied from the terminal PVG1 to the first valve gate electrode VG1. Accordingly, an unnecessary charge from the unused corner register 16 and multiplication register 18 is prevented from flowing in the output register 14. As a result, noise in an output signal from the solid-state imaging device 10 is reduced.

Further, in the solid-state imaging device 10, even when a larger amount of charge than the amount of charge that can be accumulated is generated in each register, such charges are discharged by the overflow drains 26a and 26b. Therefore, the influence of a charge from the unused register on other elements is reduced.

Figure 7:
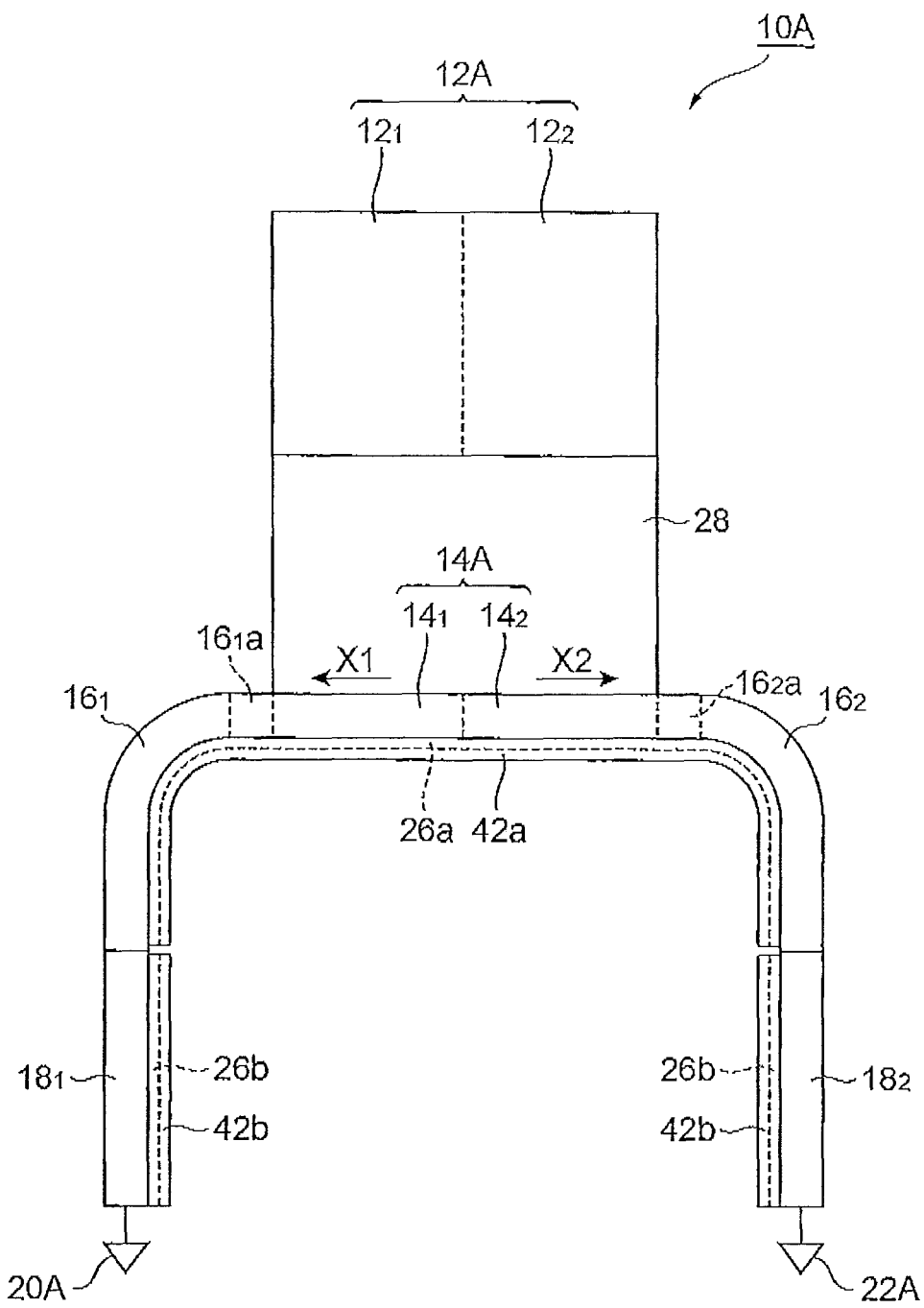
FIG. 7 is a view showing a solid-state imaging device according to another embodiment.

Hereinafter, a solid-state imaging device according to another embodiment of the present invention will be described. FIG. 7 is a view showing a solid-state imaging device according to another embodiment, and FIG. 8 is a view showing with wiring the solid-state imaging device shown in FIG. 7.

Figure 8:
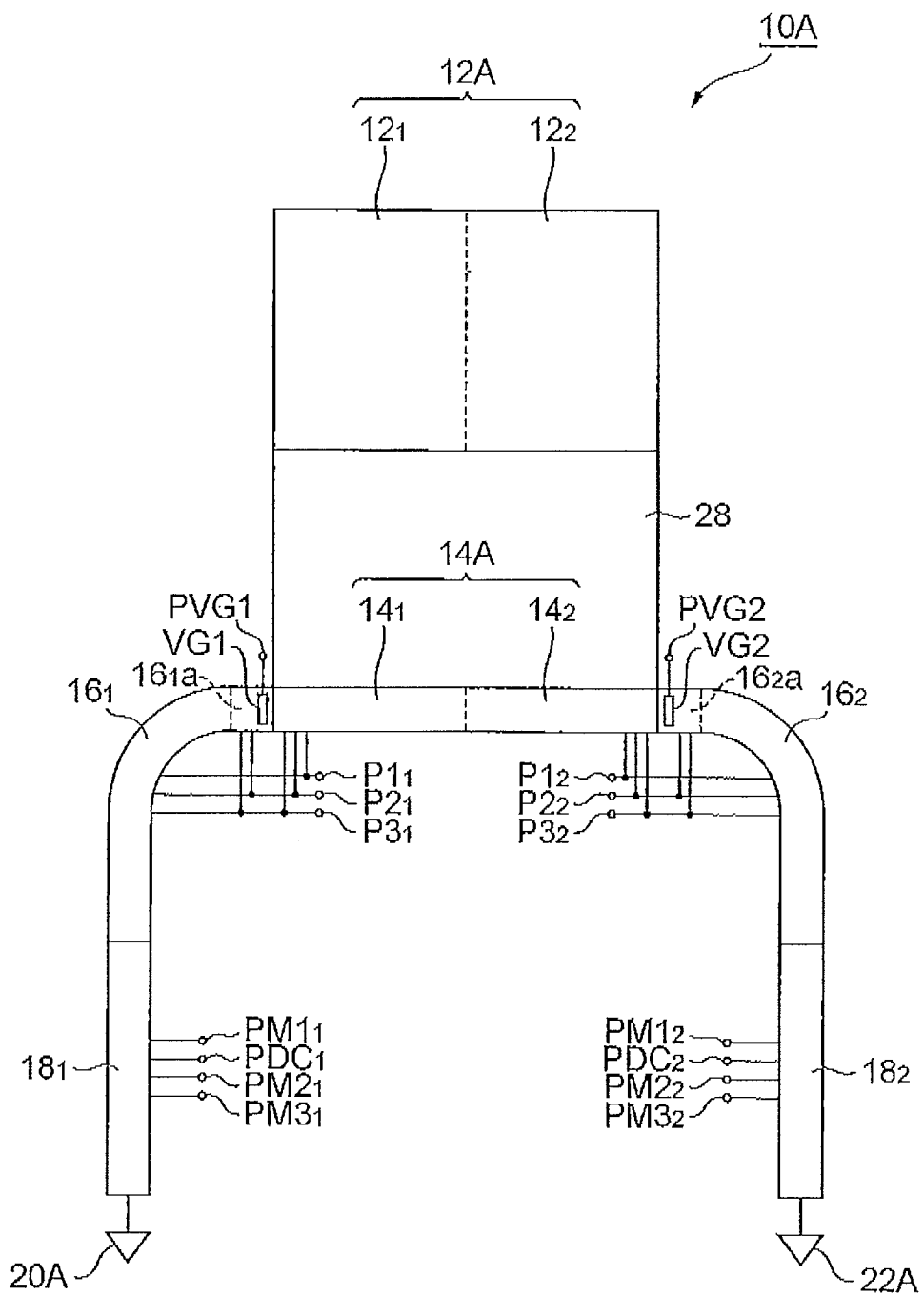
FIG. 8 is a view showing with wiring the solid-state imaging device shown in FIG. 7.

The solid-state imaging device 10A shown in FIG. 7 and FIG. 8 is a dual-part solid-state imaging device, and includes an imaging region 12A, an output register 14A, a first corner register $16_1$, a second corner register $16_2$, a first multiplication register $18_1$, a second multiplication register $18_2$, a first amplifier 20A, a second amplifier 22A, a first valve gate electrode VG1, and a second valve gate electrode VG2. In addition, the solid-state imaging device 10A may further include overflow drains 26a and 26b.

The imaging region 12A is, like the imaging region 12 of the solid-state imaging device 10, a region that generates a charge in response to incident light. The imaging region 12A contains a first area $12_1$ and a second area $12_2$. The first area $12_1$ and the second area $12_2$ are, in the figure, areas arranged side by side in the horizontal direction. The first area $12_1$ and the second area $12_2$ each contain a plurality of pixel columns.

In addition, the solid-state imaging device 10A is also a frame transfer CCD image sensor including a charge accumulating region 28. However, the solid-state imaging device of the present invention may be an interline CCD image sensor or a full-frame transfer CCD image sensor.

The output register 14A is a transfer register that transfers, in the horizontal direction, a charge transferred in the vertical direction from the imaging region 12A. The output register 14A can selectively transfer the charge from the imaging region 12A in one direction X1 and the other direction X2 opposite to the one direction X1.

In the present solid-state imaging device 10A, the output register 14A contains a first output register $14_1$ and a second output register $14_2$. The first output register $14_1$ is a transfer register that receives a charge from the first area $12_1$, and the second output register $14_2$ is a transfer register that receives a charge from the second area $12_2$.

The first output register $14_1$ is connected with wirings extending from terminals $P1_1$, $P2_1$, and $P3_1$. Moreover, the second output register $14_2$ is connected with wirings extending from terminals $P1_2$, $P2_2$, and $P3_2$. The first output register $14_1$, as a result of 3-phase clock signals being supplied in a partially overlapped manner to the terminals $P1_1$, $P2_1$, and $P3_1$ in this order, transfers a charge in one direction X1. Moreover, the first output register $14_1$, as a result of 3-phase clock signals being supplied in a partially overlapped manner to the terminals $P3_1$, $P2_1$, and $P1_1$ in this order, transfers a charge in the other direction X2. The second output register $14_2$, as a result of 3-phase clock signals being supplied to the terminals $P1_2$, $P2_2$, and $P3_2$ in this order, transfers a charge in the other direction X2. Moreover, the second output register $14_2$, as a result of 3-phase clock signals being supplied to the terminals $P3_2$, $P2_2$, and $P1_2$ in this order, transfers a charge in one direction X1.

The first corner register $16_1$ is a transfer register that transfers, to the first multiplication register $18_1$, a charge transferred from the output register 14A. The second corner register $16_2$ is a register that transfers, to the second multiplication register $18_2$, a charge from the output register 14A.

The wirings extending from the terminals $P1_1$, $P2_1$, and $P3_1$ are wirings common to the first output register $14_1$ and the first corner register $16_1$, and connected also to the first corner register $16_1$. Moreover, the wirings extending from the terminals $P1_2$, $P2_2$, and $P3_2$ are wirings common to the second output register $14_2$ and the second corner register $16_2$, and connected also to the second corner register $16_2$.

The first valve gate electrode VG1 in the solid-state imaging device 10A is an electrode closest to the output register 14A out of a plurality of electrodes that are included in a stage $16_1$a of the first coma register $16_1$ that is adjacent to the output register 14A and to which clock signals are supplied. The first valve gate electrode VG1 is connected with a wiring from the terminal PVG1. In the case of transferring a charge by the first corner register $16_1$ and outputting a signal from the first amplifier 20A, to the first valve gate electrode VG1 the same clock signal as a clock signal to be supplied from the terminal $P1_1$ is supplied from the terminal PVG1. On the other hand, in the case of not using the first corner register $16_1$, a predetermined voltage is supplied to the first valve gate electrode VG1 from the terminal PVG1. Accordingly, a charge is prevented from flowing in the output register 14A from the first corner register $16_1$.

Moreover, the second valve gate electrode VG2 is an electrode closest to the output register 14A out of a plurality of electrodes that are included in a stage $16_2$a of the second corner register $16_2$ that is adjacent to the output register 14A and to which clock signals are supplied. The second valve gate electrode VG2 is connected with a wiring from the terminal PVG2. In the case of transferring a charge by the second corner register $16_2$ and outputting a signal from the second amplifier 22A, to the second valve gate electrode VG2, the same clock signal as a clock signal to be supplied from the terminal $P1_2$ is supplied from the terminal PVG2. On the other hand, in the case of not using the second corner register $16_2$, a predetermined voltage is supplied to the second valve gate electrode VG2 from the terminal PVG2. Accordingly, a charge is prevented from flowing in the output register 14A from the second corner register $16_2$.

The first multiplication register $18_1$ is a register that multiplies a charge by an impact ionization effect, and transfers the multiplied charge. The first multiplication register $18_1$ receives a charge from the first corner register $16_1$ to generate a multiplied charge, and transfers the multiplied charge to the first amplifier $20_1$.

The first multiplication register $18_1$ is connected with wirings extending from terminals $PM1_1$, $PDC_1$, $PM2_1$, and $PM3_1$. The terminals $PM1_1$, $PM2_1$, and $PM3_1$ are terminals for inputting 3-phase clock signals to the first multiplication register $18_1$. Moreover, the terminal $PDC_1$ is a terminal that is input with a DC voltage for forming a barrier in the first multiplication register $18_1$. The first multiplication register $18_1$, as a result of receiving signals input to these terminals $PM1_1$, $PDC_1$, $PM2_1$, and $PM3_1$, generates a multiplied charge, and transfers the charge.

The second multiplication register $18_2$ is also a register that multiplies a charge by an impact ionization effect, and transfers the multiplied charge. The second multiplication register $18_2$ receives a charge from the second corner register $16_2$ to generate a multiplied charge, and transfers the multiplied charge to the second amplifier $20_2$.

The second multiplication register $18_2$ is connected with wirings extending from terminals $PM1_2$, $PDC_2$, $PM2_2$, and $PM3_2$. The terminals $PM1_2$, $PM2_2$, and $PM3_2$ are terminals for inputting 3-phase clock signals to the second multiplication register $18_2$. Moreover, the terminal $PDC_2$ is a terminal that is input with a DC voltage for forming a barrier in the second multiplication register $18_2$. The second multiplication register $18_2$, as a result of receiving signals input to these terminals $PM1_2$, $PDC_2$, $PM2_2$, and $PM3_2$, generates a multiplied charge, and transfers the charge.

The first amplifier 20A receives a charge multiplied by the first multiplication register $18_1$ to perform charge-voltage conversion, and outputs a signal according to the amount of charge received. As the first amplifier 20A, a floating diffusion amplifier may be used.

The second amplifier 22A receives a charge multiplied by the second multiplication register $18_2$ to perform charge-voltage conversion, and outputs a signal according to the amount of charge received. A floating diffusion amplifier may also be used for the second amplifier 22A.

The overflow drain 26a is provided along edges of the output register 14A, the first corner register $16_1$, and the second corner register $16_2$. Above the overflow drain 26a, as in the structure of the solid-state imaging device 10, an overflow gate 42a is provided. This overflow drain 26a, as a result of a predetermined voltage being supplied to the overflow gate 42a, can discharge a charge from the output register 14A, the first corner register $16_1$, and the second corner register $16_2$.

Moreover, along each of the edges of the first multiplication register $18_1$ and the second multiplication register $18_2$, there is provided the overflow drain 26b. Above the overflow drain 26b, as in the structure of the solid-state imaging device 10, an overflow gate 42b is provided. The overflow drain 26b, as a result of a predetermined voltage being supplied, can discharge a charge from the first multiplication register $18_1$ and the second multiplication register $18_2$.

Also, as in the case of the solid-state imaging device 10, there may be formed, in place of the overflow gate, an $n^-$-type semiconductor region between the n-type semiconductor region and the overflow drain.

Hereinafter, the operation of the solid-state imaging device 10A will de described. In the solid-state imaging device 10A, when outputting signals from two ports, that is, when outputting signals from the first amplifier 20A and the second amplifier 22A, a charge from the first area $12_1$ is transferred by the first output register $14_1$ in one direction X1. Moreover, a charge from the second area $12_2$ is transferred by the second output register $14_2$ in the other direction X2.

The charge from the first output register $14_1$ is transferred to the first multiplication register $18_1$ via the first corner register $16_1$. Next, a multiplied charge is generated by the first multiplication register $18_1$. Then, a signal based on the charge multiplied by the first multiplication register $18_1$ is generated by the first amplifier 20A.

The charge from the second output register $14_2$ is transferred to the second multiplication register $18_2$ via the second corner register $16_2$. Next, a multiplied charge is generated and transferred by the second multiplication register $18_2$. Then, a signal based on the charge multiplied by the second multiplication register $18_2$ is generated by the second amplifier 22A. Thus, in the case of performing an operation with two ports, the solid-state imaging device 10A is capable of outputting signals at high speed.

On the other hand, there is a case where not outputting signals from two ports but outputting a signal based on a charge from the whole area of the imaging region 12A from only one of the first amplifier 20A and the second amplifier 22A is desired although the operation slows down. This is for eliminating from an output signal the influence of a difference in gain between two multiplication registers when the two multiplication registers are used.

For example, in the case of outputting a signal from only the first amplifier 20A, a charge from the whole area of the imaging region 12A is transferred by the output register 14A in one direction X1. The charge from the output register 14A is transferred to the first multiplication register $18_1$ via the first corner register $16_1$. Next, a multiplied charge is generated by the first multiplication register $18_1$. Then, a signal based on the charge multiplied by the first multiplication register $18_1$ is generated by the first amplifier 20A.

In the case of outputting a signal only from the first amplifier 20A as such, a predetermined voltage is supplied to the second valve gate electrode VG2. Accordingly, a charge from the unused second corner register $16_2$ and second multiplication register $18_2$ is prevented from flowing into the output register 14A. As a result, noise in a signal to be output from the first amplifier 20A is reduced.

In addition, in the case of outputting a signal only from the second amplifier 22A, a charge from the whole area of the imaging region 12A is transferred by the output register 14A in the other direction X2. The charge from the output register 14A is transferred to the second multiplication register $18_2$ via the second corner register $16_2$. Next, a multiplied charge is generated and transferred by the second multiplication register $18_2$. Then, a signal based on the charge multiplied by the second multiplication register $18_2$ is generated by the second amplifier 22A.

In the case of outputting a signal only from the second amplifier 22A as such, a predetermined voltage is supplied to the first valve gate electrode VG1. Accordingly, a charge from the unused first corner register $16_1$ and first multiplication register $18_1$ is prevented from flowing in the output register 14A. As a result, noise in a signal to be output from the second amplifier 22A is reduced.

Further, in the solid-state imaging device 10A, even when a larger amount of charge than the amount of charge that can be accumulated is generated in each register, those charges are discharged by the overflow drains 26a and 26b. Therefore, the influence of a charge from the unused register on other elements is reduced.

It should be noted that the present invention is not limited to the foregoing embodiments, and can be variously modified. For example, the solid-state imaging device of the foregoing embodiments are three-phase drive solid-state imaging devices, but the solid-state imaging device of the present invention may be a four-phase drive solid-state imaging device, and the number of phases of the clock signals to be input is by no means limited.

Moreover, the structure shown in FIG. 1 and the structure shown in FIG. 7 may be multi-ported. Specifically, the solid-state imaging device of the present invention may include a plurality of units, each one of which is a structure containing the output register 14, the corner register 16, the multiplication register 18, the first amplifier 20, the second amplifier 22, and the first valve gate electrode VG1 of the solid-state imaging device 10. In this case, the output register of each unit transfers a charge from a corresponding pixel columns of the imaging region. In each unit, the second valve gate VG2, the overscan element 24, and the overflow drains 26a and 26b may be included.

Moreover, the solid-state imaging device of the present invention may include a plurality of units, each one of which is a structure containing the output register 14, the corner registers $16_1$ and $16_2$, the multiplication registers $18_1$ and $18_2$, the amplifiers 20A and 22A, and the valve gate electrodes VG1 and VG2 of the solid-state imaging device 10A. In this case, the output register of each unit transfers a charge from a corresponding pixel columns of the imaging region. In each unit, the overflow drains 26a and 26b may be included.

Further, although the solid-state imaging device 10A shown in FIG. 7 is a dual-port solid-state imaging device, the solid-state imaging device of the present invention may be a multi-port solid-state imaging device including a plurality of units, each one of which is a structure containing an output register that receives a charge from a corresponding pixel columns of the imaging region, a corner register that transfers the charge from the output register, a multiplication register that receives the charge from the corner register to generate a multiplied charge, an output register that generates a signal based on the multiplied charge from the multiplication register, and a valve gate electrode that prevents charge from flowing into the output register from the corner register.

REFERENCE SIGNS LIST

10 . . . Solid-state imaging device, 12 . . . Imaging region, 14 . . . Output register, 16 . . . Corner register, 18 . . . Multiplication register, 20 . . . First amplifier, 22 . . . Second amplifier, 24 . . . Overscan element, 26a, 26b . . . Overflow drain, 28 . . . Charge accumulating region, 3 . . . P-type substrate, 32 . . . P-type epitaxial layer, 34 . . . N-type region, 36 . . . Electrode, 38 . . . Channel stop layer, 40 . . . Dielectric layer, 42a, 42b . . . Overflow gate, 44 . . . Dielectric layer, 46 . . . N-type semiconductor region, P1, P2, P3, PM1, PM2, PM3, PDC, PVG1 PVG2 . . . Terminal, VG1 . . . First valve gate electrode, VG2 . . . Second valve gate electrode, 10A . . . Solid-state imaging device, 12A . . . Imaging region, $12_1$ . . . First area, $12_2$ . . . Second area, 14A . . . Output register, $14_1$ . . . First output register, $14_2$ . . . Second output register, $16_1$ . . . First corner register, $16_2$ . . . Second corner register, $18_1$ . . . First multiplication register, $18_2$ . . . Second multiplication register, 20A . . . First amplifier, 22A . . . Second amplifier, $P1_1$, $P2_1$, $P3_1$, $P1_2$, $P2_2$, $P3_2$, $PM1_1$, $PM2_1$, $PM3_1$, $PM1_2$, $PM2_2$, $PM3_2$, $PDC_1$, $PDC_2$ . . . Terminal.

The invention claimed is:

1. A solid-state imaging device comprising:
an imaging region;
an output register that receives a charge transferred from the imaging region to transfer said charge, said output register being capable of selectively transferring a charge in one direction and in the other direction opposite to said one direction;
a corner register that transfers a charge transferred in the one direction from the output register, the corner register including stages each having electrodes which are capable of receiving clock signals, respectively;
a multiplication register that receives a charge from the corner register to generate a multiplied charge;
a first amplifier that outputs a signal based on a multiplied charge from the multiplication register;
a second amplifier that generates a signal based on a charge transferred in the other direction by the output register;
a valve gate electrode for preventing a transfer of a charge between the output register and the corner register, the valve gate electrode being one of the electrodes which is positioned closest to the output register and is included in one of the stages which is adjacent to the output register;
common terminals connected to the electrodes of the stages other than the valve gate electrodes, respectively, and;
a terminal connected to the valve gate electrode.

2. The solid-state imaging device according to claim 1, further comprising an overflow drain for discharging a charge accumulated in the corner register and the multiplication register.

3. The solid-state imaging device according to claim 1, further comprising:
an overscan element being a register for transferring a charge transferred in the other direction from the output register to the second amplifier, the overscan element including stages each having electrodes which are capable of receiving clock signals, respective; and
another valve gate electrode for preventing a transfer of a charge between the output register and the overscan element, the other valve gate electrode being one of the electrodes which is positioned closest to the output register and is included in one of the stages of the overscan element which is adjacent to the output register,
wherein the common terminals are connected to the electrodes of the stages of the overscan element other than the valve gate electrodes, respectively, and
the solid-state imaging device further comprises another terminal connected to the other valve gate electrode.

4. A solid-state imaging device comprising:
an imaging region;
an output register that receives a charge transferred from the imaging region to transfer said charge, said output register being capable of selectively transferring a charge in one direction and in the other direction opposite to said one direction;
a first corner register that transfers a charge transferred in the one direction from the output register, the first corner register including stages each having electrodes which are capable of receiving clock signals, respectively;
a first multiplication register that receives a charge from the first corner register to generate a multiplied charge;
a first amplifier that generates a signal based on a multiplied charge from the first multiplication register;
a second corner register that transfers a charge transferred in the other direction from the output register, the second corner register including stages each having electrodes which are capable of receiving clock signals, respectively;
a second multiplication register that receives a charge from the second corner register to generate a multiplied charge;
a second amplifier that generates a signal based on a multiplied charge from the second multiplication register;
a first valve gate electrode for preventing a transfer of a charge between the output register and the first corner register, the first valve gate electrode being one of the electrodes which is positioned closest to the output register and is included in one of the stages of the first corner register which is adjacent to the output register;
a second valve gate electrode for preventing a transfer of a charge between the output register and the second corner register, the second valve gate electrode being one of the electrodes which is positioned closest to the output register and is included in one of the stages of the second corner register which is adjacent to the output register;
first common terminals connected to the electrodes of the stages of the first corner register other than the first valve gate electrodes, respectively;
a first terminal connected to the first valve gate electrode;
second common terminals connected to the electrodes of the stages of the second corner register other than the second valve gate electrodes, respectively; and a second terminal connected to the second valve gate electrode.

5. The solid-state imaging device according to claim 4, further comprising an overflow drain for discharging a charge accumulated in the first and second corner registers and the first and second multiplication registers.

* * * * *